United States Patent [19]

Inokawa et al.

[11] Patent Number: 5,213,991
[45] Date of Patent: May 25, 1993

[54] METHOD OF MANUFACTURING SEMICONDUCTOR DEVICE

[75] Inventors: Hiroshi Inokawa, Zama; Toshio Kobayashi, Isehara; Kazuhide Kiuchi, Tokyo, all of Japan

[73] Assignee: Nippon Telegraph and Telephone Corporation, Tokyo, Japan

[21] Appl. No.: 856,801

[22] Filed: Mar. 24, 1992

Related U.S. Application Data

[63] Continuation of Ser. No. 366,240, Jun. 12, 1989, abandoned, which is a continuation of Ser. No. 9,790, Feb. 2, 1987, abandoned.

[30] Foreign Application Priority Data

Feb. 7, 1986 [JP] Japan .................. 61-24021
Mar. 31, 1986 [JP] Japan .................. 61-73989

[51] Int. Cl.⁵ ................... H01L 21/336; H01L 21/205
[52] U.S. Cl. .............................. 437/41; 437/99
[58] Field of Search ............... 437/41, 84, 90, 99, 437/105, 109, 162, 186, 192, 193, 203, 241, 243, 967, 973; 357/23.1, 23.9, 23.11

[56] References Cited

U.S. PATENT DOCUMENTS

| | | |
|---|---|---|
| 3,189,973 | 6/1965 | Edwards et al. ............... 437/99 |
| 3,600,651 | 8/1971 | Duncan . |
| 4,041,518 | 8/1977 | Shimizu et al. ............... 437/99 |
| 4,381,202 | 4/1983 | Mori et al. .................. 437/41 |
| 4,462,847 | 7/1984 | Thompson et al. ............. 437/99 |
| 4,504,332 | 3/1985 | Shinada .................... 437/99 |
| 4,717,689 | 1/1988 | Maas et al. ................. 437/41 |
| 4,966,861 | 10/1990 | Mieno et al. ............... 437/99 |

FOREIGN PATENT DOCUMENTS

| | | |
|---|---|---|
| 0028654 | 5/1981 | European Pat. Off. . |
| 0077737 | 4/1983 | European Pat. Off. . |
| 0115557 | 9/1981 | Japan .................... 437/99 |
| 0034943 | 3/1983 | Japan .................... 437/99 |
| 59-123224 | 7/1984 | Japan . |
| 0085839 | 5/1986 | Japan .................... 437/99 |
| 0220419 | 9/1986 | Japan .................... 437/99 |
| 8404995 | 12/1984 | World Int. Prop. O. ...... 437/99 |

OTHER PUBLICATIONS

Patent Abstracts of Japan, vol. 8, No. 247 (E-278) (1684). Nov. 13, 1984 (1 page).
Wolf and Tauber, Silicon Processing for the VLSI Era, vol. 1: Process Technology, Lattice Press, 1986, pp. 142-143.
Claasen et al., "The Nucleation of CVD Silicon on $SiO_2$ and $Si_3N_4$ Substrates", J. Electrochem. Soc., vol. 128, No. 6, Jun. 1981, pp. 1353-1359.

Primary Examiner—Mary Wilczewski
Attorney, Agent, or Firm—Samuels, Gauthier & Stevens

[57] ABSTRACT

In a method of making a MOSFET-type semiconductor device of this invention, a surface of a semiconductor substrate is covered in a predetermined pattern with an insulating layer comprising a silicon-nitride-containing film or with an insulating layer whose top surface and side surfaces bear a silicon-nitride-containing film, thereby forming on the semiconductor substrate a recess region at which the semiconductor substrate is exposed. An epitaxial silicon film and polycrystalline silicon film are formed simultaneously on the exposed semiconductor substrate and on the insulating film, respectively. A whole channel region and a part of source and drain diffused-layer regions are formed in the epitaxial silicon film, and source and drain diffused-layer regions are formed in the polycrystalline silicon film. A gate electrode of this MOSFET-type semiconductor device may be formed at the recess region by a self-align method.

4 Claims, 4 Drawing Sheets

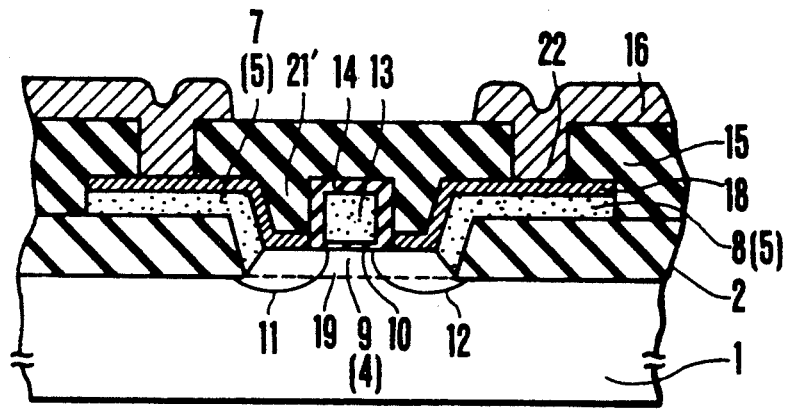
F I G. 1 (A)
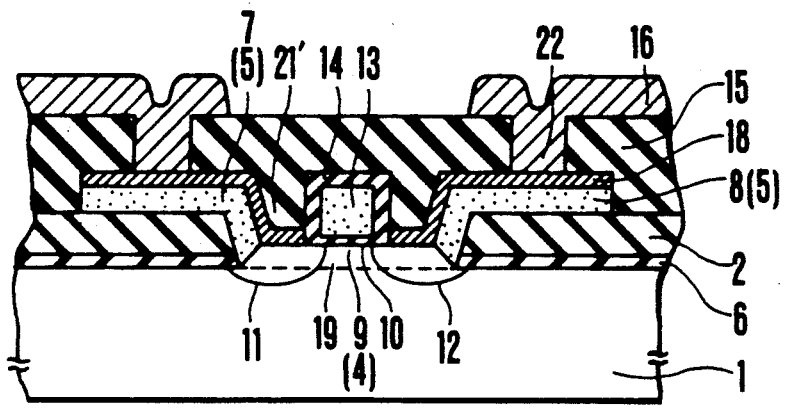
F I G. 1 (B)
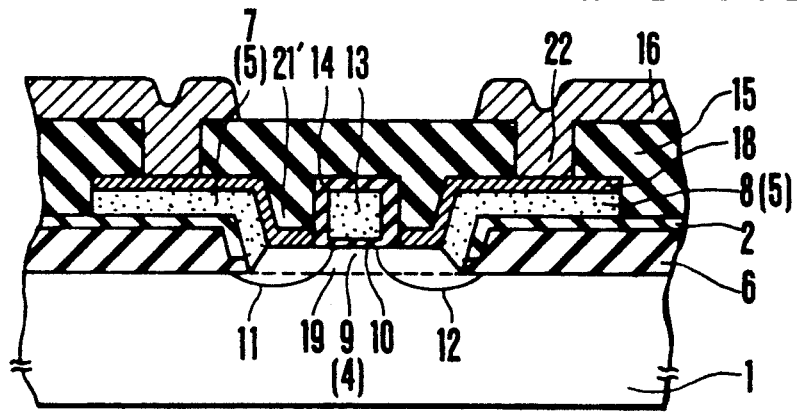
F I G. 1 (C)
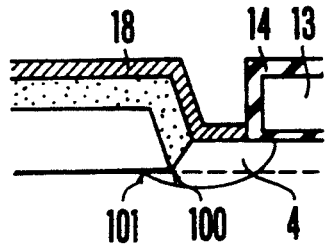
F I G. 1 (D)

METHOD OF MANUFACTURING SEMICONDUCTOR DEVICE

This is a continuation of application Ser. No. 07/366,240, filed on Jun. 12, 1989, now abandoned, which is a continuation of application Ser. No. 07/009,790 filed on Feb. 2, 1987, now abandoned.

BACKGROUND OF THE INVENTION

The present invention relates to a method of manufacturing a semiconductor device.

When a field effect semiconductor device such as a MOSFET is miniaturized in accordance with a known scale-down scheme, the concentration of dopant is the semiconductor substrate increases and the junction depth becomes very shallow. Meanwhile, alignment precision in the lithography technique is not improved in proportion to miniaturization of MOSFETs. For this reason, in MOSFETs having a normal structure, relative alignment margins between the gate and a contact and between an isolation region and a contact must be increased upon miniaturization of the MOSFETs. Therefore, the area of a diffused layer cannot be decreased in proportion to the gate area of a MOSFET. As the miniaturization progresses, a relative parasitic capacitance caused by the capacitance of the diffused layer increases, and interferes with improvement in performance upon miniaturization. Since the junction depth is very shallow, a metal material of an upper electrode may often extend through a junction under a contact hole. Such problems must be solved in order to realize LSIs of higher density and higher operating speed.

A silicon on insulator (SOI) has been conveniently used in an attempt to solve the problem. In the device using SOI, a semiconductor layer on an insulating substrate serves as an active layer, i.e., source, drain and channel regions are formed in the semiconductor layer on an insulating substrate.

Another conventional way to solve the problems is to make the device in a special structure in which the main source and drain regions are formed on a thick field insulating film. This structure is different from SOI in that the channel region is electrically connected to the semiconductor substrate and is not electrically floating.

For example, in the former method, when the SOI substrate is used, the parasitic capacitance can be reduced by the SOI substrate itself, a junction breakdown under the contact hole cannot occur, and device isolation can be perfectly performed, but the electronic characteristics of the resulting device are unstable due to variations in substrate potential. A very thin semiconductor layer which is formed on the insulating film and has the same depth as the junction depth has poor crystallinity, and its formation process is complicated.

In the latter method, when the main source and drain regions are formed on a region of the thick field insulating film, the metal electrode cannot break the junction under the contact hole region, and a parasitic capacitance of the diffused layer can be reduced, but the following problems are encountered. In this method, in order to form a miniaturized MOSFET and to reduce the parasitic capacitance a, high-precision alignment between a gate pattern and a field insulating film is required. If an alignment margin is too large, a junction area contacting the substrate increases accordingly, and the parasitic capacitance undesirably increases. In addition, since the mask alignment margin is required, any increase in integration density in LSI is limited. When the main source and drain regions are formed on the thick field insulating film, a silicon dioxide film is used as the field insulating film. Therefore, a silicon thin film formed on the field insulating film cannot have the desired characteristics. More specifically, when silicon is deposited on silicon dioxide under the condition wherein an excellent epitaxial crystal can be grown on a monocrystalline substrate (e.g., by the CVD method at high temperatures of 700° C. or higher), the silicon on the silicon dioxide has a roughened surface due to its granular growth. This is estimated to be caused because an interfacial free energy between the silicon dioxide film and the silicon is large, and the silicon reacts with the silicon dioxide to increase the size of the silicon crystal grains.

For this reason, the thickness of the silicon thin film deposited on the silicon dioxide cannot be decreased (below 0.3 μm), and it is difficult to miniaturize a device. Conversely, under the deposition conditions wherein the surface of the silicon thin film on the silicon dioxide is smoothed (e.g., by the CVD method at low temperatures of 600° C. or lower), the epitaxial silicon film grown on the monocrystalline substrate has poor crystallinity, and the characteristics of a device are degraded.

As described above, in the conventional techniques, a silicon film having a smooth surface and good crystallinity cannot be formed on a silicon substrate, a portion of which is exposed and the remaining portion of which is covered with an insulating film. As a result, a miniaturized high-speed MOSFET having a small parasitic capacitance cannot be manufactured.

SUMMARY OF THE INVENTION

It is a principal object of the present invention to provide a method of manufacturing a semiconductor substrate for a field effect transistor which can be miniaturized, can reduce a parasitic capacitance, can improve reliability of a contact between a diffused layer and a metal electrode, and to provide a field effect transistor using the semiconductor substrate.

It is another object of the present invention to provide a method of manufacturing a semiconductor device, wherein a semiconductor substrate which has a silicon thin film having a smooth surface and good crystallinity can be easily manufactured.

In order to achieve the above objects, there is provided: a semiconductor device comprising: an insulating layer which has, at least as a surface layer, an insulating film consisting of silicon nitride or an insulating film containing silicon nitride as a major component, formed on a semiconductor substrate in a predetermined pattern so as to form a recess region at which the semiconductor substrate is exposed; a monocrystalline silicon film formed on the recess region at which the semiconductor substrate is exposed; a polycrystalline silicon film formed on the insulating layer adjacent to the recess region, a boundary between the monocrystalline silicon film and the polycrystalline silicon film being located at an edge of the insulating layer; and a gate electrode formed on a gate insulating film, on the monocrystalline silicon film the gate electrode being formed in a self-alignment manner at a substantially equal distance from the edge of the insulating layer, and active regions being formed in the silicon film.

There is also provided according to the present invention a method of manufacturing a semiconductor device comprising the steps of: covering a surface of a semiconductor substrate with an insulating layer having an insulating film consisting of silicon nitride or an insulating film containing silicon nitride as a major component at least as a surface layer in a predetermined pattern, thereby forming on the semiconductor substrate a recess region which is not covered with the insulating layer and at which the semiconductor substrate is exposed to form a silicon film extending from the recess region at which the semiconductor substrate is exposed onto the insulating layer adjacent to the recess region; and forming active regions of the semiconductor device in the silicon film.

BRIEF DESCRIPTION OF THE DRAWINGS

FIGS. 1(A) to 1(D) are sectional views showing a field effect semiconductor device according to an embodiment of the present invention;

DESCRIPTION OF THE PREFERRED EMBODIMENTS

Figure 2A:
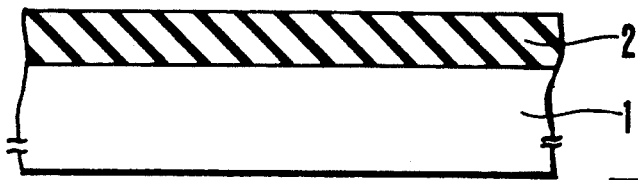
FIGS. 2a to 2d are sectional views showing the steps in the manufacture of the semiconductor device shown in FIG. 1(A)

FIGS. 1(A) to 1(C) show a semiconductor device according to an embodiment of the present invention.

The structure shown in FIG. 1(A) will be described below. A silicon nitride film 2 is formed on a silicon substrate 1, so that the substrate 1 is left partially exposed. A monocrystalline silicon film 4 is formed on the exposed substrate, and a polycrystalline silicon film 5 is formed on the upper and side surfaces of the silicon nitride film 2. A gate insulating film 10 is located at the central portion of the monocrystalline silicon film 4, and a gate electrode 13 is formed thereon. The gate electrode 13 is isolated from the polycrystalline silicon film 5 by a groove 21' having a width that is substantially the same as the thickness of the gate electrode 13. A channel region 9 is formed in the monocrystalline silicon film 4 immediately below the gate insulating film 10, and diffused regions 11 and 12 are formed on both sides of the channel region 9. The polycrystalline silicon film 5 serves as a source region 7 and a drain region 8. The source and drain regions 7 and 8 are covered with an insulating film 15, and are partially connected to an electrode 16 which serves as a source or drain electrode. A film 18 for decreasing a resistance is formed on the surface of a silicon thin film 19 (except for a portion on which the gate insulating film 10 is formed). The film 18 need not always be formed.

In the structure of FIG. 1(B), a thin silicon oxide film 6 is located under the silicon nitride film 2 shown in FIG. 1(A).

In the structure of FIG. 1(C), the thick silicon oxide film 6 is located under the thin silicon nitride film 2 shown in FIG. 1(A), so that the silicon nitride film 2 covers the surface of the silicon oxide film 6.

The method of manufacturing the semiconductor device shown in FIGS. 1(A) to 1(C) will be described with reference to FIGS. 2 to 6. Although an embodiment will be exemplified below, the present invention is not limited thereto and various changes and modifications may be made within the spirit and scope of the invention.

Figure 2B:
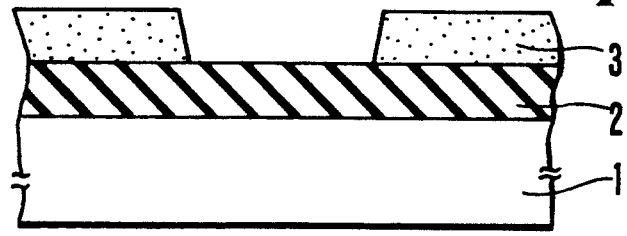
Figure 2C:
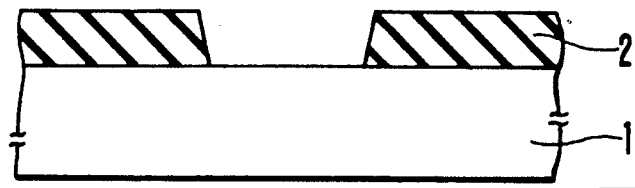

A silicon nitride film 2 is formed as a relatively thick insulating film on a monocrystalline silicon substrate 1 having a (100) surface by a chemical vapor deposition method (to be referred to as a CVD method preferably 0.2 to 0.8 μm (FIG. 2a). A resist pattern 3 which is patterned by photolithography is formed on the resultant structure (FIG. 2b). The silicon nitride film 2 is etched by Reactive Ion Etching (to be referred to as RIE hereinafter) to expose the silicon substrate 1 (FIG. 2c). The width of the exposed substrate surface is, e.g., 1.6 μm in the sectional view in FIG. 2c.

Figure 2D:
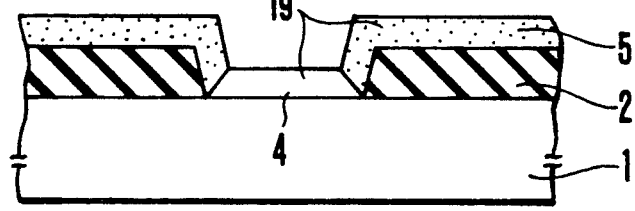

Thereafter, a silicon thin film 19 (0.02 to 0.3 μm) is formed by the CVD method at high temperature of 700° C. or higher or a molecular beam epitaxy method (to be referred to as an MBE method hereinafter) (FIG. 2d). In this case, the silicon thin film 19 formed on the substrate 1 corresponds to a monocrystalline silicon thin film 4 and the silicon thin film 19 formed on the silicon nitride film 2 corresponds to a polycrystalline silicon film 5.

At this time, if the cross-section is viewed from a (011) direction, an interface between the monocrystalline silicon thin film 4 and the polycrystalline silicon thin film 5 can be automatically defined in a 55° direction from the substrate surface, originating from an edge 100 of the insulating film 6 contacting the silicon substrate 1. If the temperature for formation of the thin film 19 is set below 700° C., silicon crystals formed by epitaxial growth have poor crystallinity. Meanwhile, if it is set above 1,100° C., the silicon layer formed on the insulating film 2 undesirably has a considerable roughened surface.

With the above processes, the monocrystalline silicon thin film 4 having a good quality can be formed on the silicon substrate 1 since a temperature of 700° C. or higher is used. Since the silicon nitride film 2 whose initial nuclear density (crystal growth starts at nuclei) increases upon formation of the silicon thin film is used as the relatively thick insulating film, the surface of the polycrystalline silicon film 5 formed on the insulating film 2 can be smoothed even at a temperature of 700° C. or higher.

The insulating film 2 can be other thin films (e.g., an Si—N or Si—N—O thin film) containing silicon nitride as a major component if they can satisfy the condition wherein a nuclear density is great enough at the initial process of formation of the silicon thin film 19 such that the surface f the silicon thin film can be smoothed.

Figure 3:
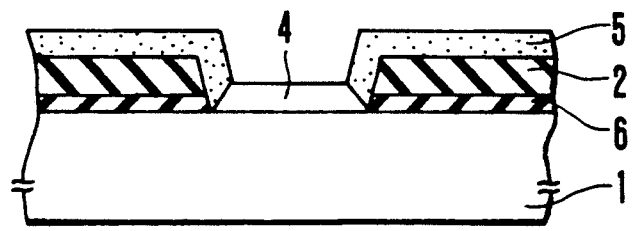
FIG. 3 is a sectional view showing a semiconductor device according to another embodiment of the present invention.

According to the manufacturing method as described above with reference to FIGS. 2a to 2d, the silicon thin film 19 which has good surface smoothness and crystallinity can be formed on the exposed surface of the silicon substrate and the thick insulating film. In this method, the monocrystalline and polycrystalline silicon thin films 4 and 5 can be formed at the same time by a single process. In the method shown in FIGS. 2a to 2d, the case has been described wherein only the thick silicon nitride film is used as the insulating layer. However, another structure can be adopted as the insulating layer. More specifically, as shown in FIG. 3, as the insulating layer, a bi-layered film (0.1 to 1.0 μm thick, preferably 0.2 to 0.8 μm thick) can be adopted which uses a silicon nitride thin film or a thin film containing silicon nitride as a major component as an upper layer 2, and a film having a low dielectric constant such as silicon dioxide, as a lower layer 6. In this case, the parasitic capacitance between the polycrystalline silicon film 5 and the silicon substrate 1 can be decreased, and the operating speed of a field effect semiconductor device that is formed on the silicon thin film 19 can be improved.

When the insulating film comprises the bi-layered structure of silicon dioxide and silicon nitride, as shown in FIG. 3, is adapted the following effect can also be provided. More specifically, since a difference in thermal expansion coefficients of silicon dioxide and silicon is smaller than that of the silicon dioxide and silicon nitride, various problems such as lattice defects, e.g., slip generated in the silicon substrate and defects, e.g., crack generated in the insulating film due to a large difference in thermal expansion coefficients of the silicon nitride film 2 and the silicon substrate 1 can be eliminated.

In FIG. 3, p-type silicon having a (100) surface is used as the silicon substrate 1. The silicon dioxide film 6 formed on the substrate 1 has a thickness less than 500Å. The silicon nitride film 2 formed on the silicon dioxide film 6 has a thickness of about 2,000Å, and these films are formed by a known method. The insulating film consisting of the silicon dioxide film 6 and the silicon nitride film 2 is etched by the same method as described above to form a groove, so that the surface of the silicon substrate 1 is exposed at the bottom of the groove. Thereafter, the silicon film is formed in a by hydrogen-diluted silane atmosphere at 950° C. At this time, the monocrystalline silicon film 4 is formed on the exposed silicon substrate 1, and the polycrystalline silicon film 5 having a good surface smoothness is formed on the insulating film. In this case, the interface between the monocrystalline silicon film 4 and the polycrystalline silicon film 5 can be automatically defined by the edge 100 of the silicon dioxide film 6 in the same manner as in FIGS. 2a to 2d.

Another embodiment will be described with reference to FIG. 4 wherein a silicon thin film is formed on an exposed silicon substrate and a thick insulating film.

Figure 4A:
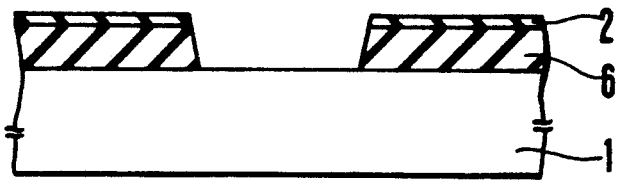
FIGS. 4a to 4d are sectional views showing the steps in the manufacture of the semiconductor device shown in FIG. 1(C)

An insulating layer which has a 1,000Å thick silicon nitride thin film 2 as an upper layer and a 3,000Å thick film 6 such as silicon dioxide having a low dielectric constant as a lower layer is formed on a silicon substrate 1. Thereafter, the resultant structure is processed by photolithography and RIE in the same manner as in FIG. 2a to 2d. As a result, a groove is formed and the silicon substrate 1 is exposed therefrom (FIG. 4a). Thereafter, the exposed silicon substrate 1 is slightly oxidized, and a 500Å thick oxide thin film 6' is formed on the surface of the substrate 1. A silicon nitride thin film 2' is again formed on the resultant structure (FIG. 4b), and the silicon nitride films 2 and 2' are subjected to anisotropic etching by RIE, and the silicon oxide thin film 9 (which prevents the substrate surface from being etched upon anisotropic etching) is then removed to expose the silicon substrate 1. As a result, a structure wherein the side walls of the insulating film 6 (silicon dioxide or the like) are covered with the silicon nitride films 2' is formed (FIG. 4c). In this case, a maximum allowable distance between the surface of the silicon substrate 1 and the distal end of the silicon nitride film 2' formed on the side wall of the recess or groove is about 500Å. If this distance is further increased, the nuclear density of the side wall of the exposed silicon dioxide film 6 in the initial process of the silicon thin film formation is decreased, and a silicon thin film formed in the next process cannot have a smooth surface.

Figure 4B:
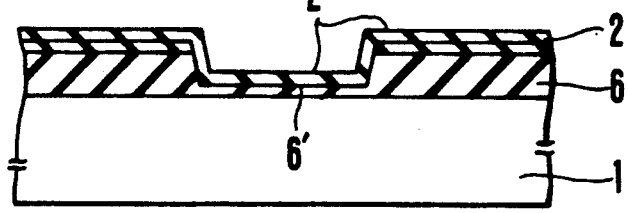
Figure 4C:
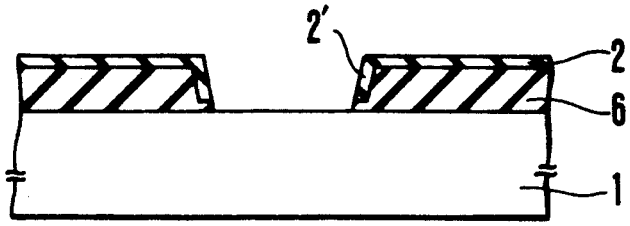
Figure 4D:
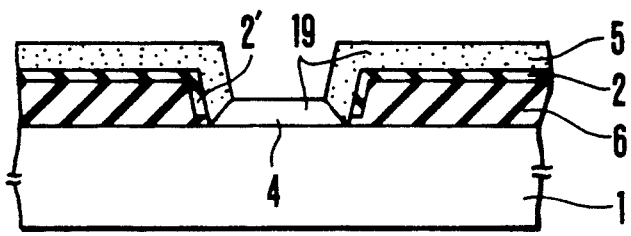

Thereafter, a silicon thin film 19 is formed by the CVD method at high temperature of 700° C. or higher or the MBE method, thereby obtaining the structure shown in FIG. 4d. In the silicon thin film 19, a portion grown directly on the silicon substrate 1 is a monocrystalline silicon film 4, and a portion formed on the insulating films 2 and 6 is a polycrystalline silicon film 5. In the structure shown in FIG. 4d, since the silicon dioxide film 6 has a small exposed portion as described above, the surface of the silicon thin film formed can be satisfactorily smoothed even on the side walls of the insulating film.

In the method shown in FIGS. 4a to 4d, the interface between the monocrystalline silicon film 4 and the polycrystalline silicon film 5 can be automatically defined by the edge 100 of the silicon dioxide film 6 in the same manner as in FIG. 2. In FIG. 4b, the silicon dioxide thin layer 6' is formed. However, this layer need not always be formed. In this case, the entire surface of the silicon dioxide film 6 is covered with the silicon nitride film 2 in FIGS. 4c and 4d.

With the method described with reference to FIGS. 2 to 4, the monocrystalline and polycrystalline silicon films are formed respectively on the exposed silicon substrate and the thick insulating film, and a boundary therebetween can be automatically defined by the edge of the insulating film. A method for manufacturing a field effect transistor on the silicon thin film obtained as described above will be described below.

Figure 5:
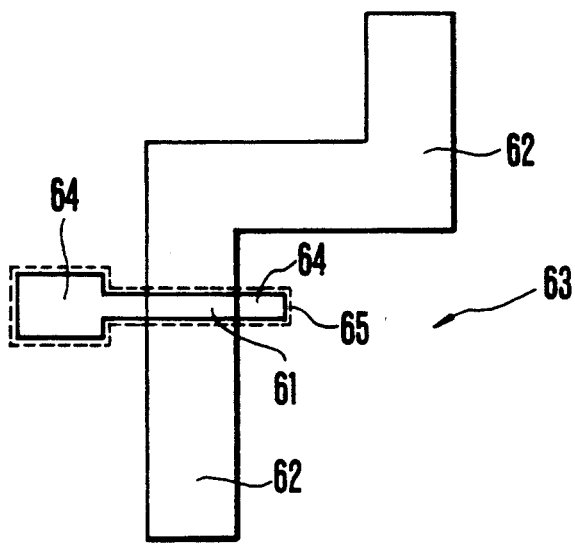
FIG. 5 is a plan view for explaining the arrangement of a device region and a gate electrode according to the present invention.
Figure 6A:
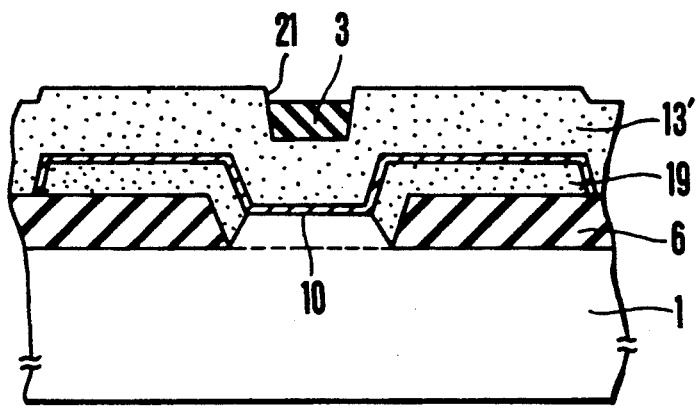
FIGS. 6a to 6c are sectional views showing the steps in the manufacture of the semiconductor device after the steps shown in FIGS. 2a to 2d or FIGS. 4a to 4d.
Figure 6B:
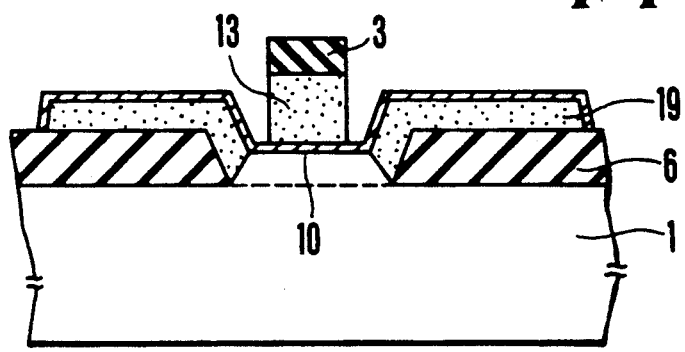
Figure 6C:
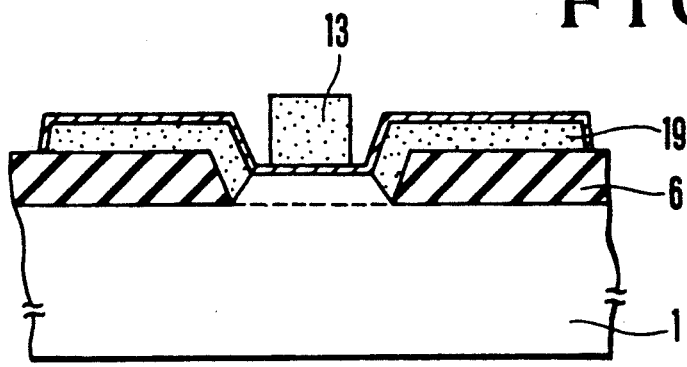

The surface of the silicon thin film 19 of the semiconductor substrate with the structure shown in FIG. 2 is oxidized. Thereafter, a masking material (e.g., a silicon dioxide film or a silicon nitride film) for determining a device region is deposited on the entire surface of the resultant structure. First, in order to pattern the silicon thin film 19, the masking material is etched using lithography and dry etching to define the device region. FIG. 5 illustrates the positional relationship on the plane between the device region (i.e., a channel region 61 and a source-drain diffused layer region 62), a device isolation region 63, and a gate contact region 64. The thick insulating film 6 lies under almost all the source-drain diffused layer region 62 and the device isolation region 63. A boundary 65 between a region on which the thick insulating film is present and a region on which no insulating film is present is indicated by the broken line in FIG. 5. The silicon thin film 19 is etched using dry etching to leave only the device regions (61 and 62), so that different device regions are isolated from each other. Then, in order to insulate a gate electrode (e.g., polycrystalline silicon film) 13 which will be formed later from the silicon substrate 1, the gate contact region 64 is oxidized. The gate contact region 64 and the channel region 61 are present in a region without the thick insulating film 6. Alternatively, selective oxidation is performed using the masking material formed on the device region as a mask (at this time, a silicon nitride film having an oxidation resistance is used as the masking material), so that the device regions are isolated and the gate electrode formation region 64 is oxidized. Thereafter, the masking material is removed, and gate oxidation is performed. A 100Å thick gate oxide thin film 10 is formed on the surface of the silicon thin film 19, and a 2,500Å thick polycrystalline silicon film 13' which serves as a gate electrode 13 and in which an impurity is doped is deposited on the resultant structure. Then, a thick resist film is coated on the structure, and the surface of the resist film is flattened. Therefore, etching back is carried out. As a result, the resist film is buried in a groove 21 that is present in a region without the thick insulating film 6, as shown in FIG. 6a, thereby forming a resist pattern 3 having a width of 0.5 μm and a thickness of about 2,000Å. The resist pattern 3 is smaller than the one defined by the boundary 65 between regions with and without the insulating film by an equal distance (corresponding to the sum of thicknesses of the silicon film 13' and the silicon thin film 19). Subsequently, the polycrystalline silicon film 13' is accurately etched by anisotropic etching, e.g., ECR plasma etching so as to form the gate electrode 13 formed of polycrystalline silicon (FIG. 6b), and the resist pattern 3 is then removed (FIG. 6c). Since the surface of the silicon thin film 19 is smoothed, as described above, the gate electrode 13 has a linear edge shape defined by self-alignment, and the miniaturized gate electrode which has no variations in channel length in a gate can be formed. With the above method, since the gate electrode 13 can be formed in the self-alignment manner with respect to the edge 100 of the insulating film 6, no mask alignment is necessary as compared to a case wherein the gate electrode is formed by the normal lithography technique. Therefore, a resultant transistor can be further miniaturized.

Thereafter, the surface of the polycrystalline silicon film as the gate electrode 13 is oxidized. At the same time, the surface of the polycrystalline silicon film 5 on the insulating film 6 serving as diffused layer 27 and 28 is oxidized. However, the film thickness of the oxide film on the polycrystalline silicon film 5 (source and drain regions 7 and 8) on the thick insulating film 6 is smaller than that of an oxide film 14 formed on the surface of the gate electrode 13 in which an impurity is doped at high concentration enough to accelerate oxidation. Subsequently, ion implantation for forming the source and drain and annealing are performed. In this case, annealing is performed under the conditions wherein an edge 101 of a p-n junction formed between the source (or drain) and the substrate 1 is located on the side of the insulating film away from the edge 100 of the insulating film, as shown in FIG. 1(D). In this manner, since the boundary between the monocrystalline silicon film 4 and the polycrystalline silicon film 5 is automatically defined by the edge 100, junction leakage will not occur. Thereafter, the oxide film on the source and drain regions 7 and 8 are removed by etching, and the silicon layers on the surfaces of the source and drain regions 7 and 8 are exposed. At this time, tungsten is selectively grown on the exposed silicon layers, or the exposed silicon layers are converted to silicide, thereby forming tungsten or silicide films 18 so as to decrease the resistance of the diffused layers. Thereafter, grooves 21' which are formed on two sides of the gate electrode 13 are buried by depositing an interlayer film or passivation film 15. Thereafter, the surface of the resultant structure is flattened. A contact hole is formed in the interlayer film or passivation film 5, and a metal layer 16 for interconnection is then formed thereon. In this manner, the field effect transistor is completed as shown in FIG. 1(A). When the semiconductor substrate shown in FIG. 3 is used in the process of FIG. 6a, the transistor is completed as shown in FIG. 1(B). When the substrate shown in FIG. 4d is used, the transistor can be completed as shown in FIG. 1(C).

According to the method of the present invention as described above, a silicon nitride film or a film containing silicon nitride as a major component, which can provide a silicon film having a smooth surface due to large nuclear density in an initial process of silicon thin film formation is used as a thick insulating film or a surface layer of the thick insulating film. Therefore, although a silicon thin film is grown on the entire surface of a region which is not covered with the thick insulating film under the condition wherein a good epitaxial monocrystalline thin film is grown, a polycrystalline silicon film having a smooth surface can be formed on the thick insulating film. The linear edge shape of the gate electrode can be formed in a self-alignment manner in the subsequent process using the above-mentioned semiconductor substrate. As a result, the miniaturized gate electrode having no variations in channel lengths in the gate (i.e., the channel length of which can be on the order of submicrons or less) can be formed. More specifically, a semiconductor substrate which has a silicon thin film having good surface smoothness and crystallinity can be easily manufactured.

After the polycrystalline silicon gate electrode is patterned, the grooves that are present on both sides of the gate electrode are buried by depositing an interlayer film or passivation film, so that the surface of the resultant structure can be flattened.

In a MOSFET manufactured as described above, since the main source and drain regions are isolated from a silicon substrate by a thick insulating film, (1) a parasitic capacitance of the source and drain is low, (2) a contact between a diffused layer and a metal electrode has high reliability, (3) a latch-up immunity is high in the case of a CMOS, (4) carrier mobility is high since a channel region is formed of monocrystalline silicon of high quality, and (5) a miniaturized gate electrode can be formed in a self-alignment manner since the surface of a silicon thin film covering the thick insulating film is smooth. Therefore, further miniaturization and high-speed operation are allowed as compared to a conventional MOSFET.

What is claimed is:

1. A method of making an MOSFET-type semiconductor device which comprises:
   (a) selectively covering an exposed surface of a semiconductor substrate with an insulating layer thereover such that a recess region of said substrate is left exposed by said insulating layer;
   (b) forming said insulating layer such that the top surface and the side surface of the insulating layer comprise a silicon-nitride film or a film containing a major portion of silicon nitride;
   (c) forming simultaneously an epitaxial silicon film on said exposed recess region and a polycrystalline silicon film on said silicon-nitride film or film containing a major portion of silicon nitride while preserving a shape having a recess, at a temperature above 700° C. and to a thickness less than 0.3 μm; and (d) forming a whole channel region and a part of source and drain diffused-layer regions in said epitaxial silicon film, and source and drain diffused-layer regions in said polycrystalline silicon film, wherein the forming of step (d) further comprises:
(1) forming a gate electrode on a gate insulating film on said epitaxial silicon film, wherein the forming of step (d)(1) further comprises:
 (i) forming said gate insulating film on said silicon film,
 (ii) forming a gate electrode material layer on said gate insulating film,
 (iii) coating said gate electrode material layer with a film of mask material in such manner as flattening the surface such that a recess which is formed on the upper surface of said gate electrode material layer in correspondence with said recess region on said semiconductor substrate is filled with said film of mask material, said recess on the upper surface of said gate electrode material layer being present in a region without said insulating layer,
 (iv) etching said film of mask material with the flat surface by a predetermined depth from the surface, thereby leaving said mask material only inside said recess on the upper surface of said gate electrode material layer,
 (v) etching said gate electrode material layer using said film of mask material as an etching mask, thereby forming said gate electrode with grooves formed on at least two sides of said gate electrode;
(2) adding a dopant to a part of said epitaxial silicon film which is not covered with said gate electrode; and
(3) adding a dopant to the polycrystalline silicon film, whereby completing a MOSFET-type semiconductor type.

2. A method according to claim 1 wherein
said semiconductor substrate is a silicon semiconductor substrate, and
said insulating layer consists of a silicon dioxide film formed on said silicon semiconductor substrate and a silicon-nitride-containing film which is formed on said silicon dioxide film.

3. A method according to claim 2 wherein said recess region has side wall and said silicon-nitride containing film extends to the side walls of said recess region.

4. A method according to claim 3 wherein said silicon-nitride-containing film extends to the side walls of said recess region, and the portion thereof in said recess region is kept isolated from the exposed silicon semiconductor substrate.

* * * * *